United States Patent
Wu et al.

(12) 
(10) Patent No.: US 6,190,995 B1
(45) Date of Patent: Feb. 20, 2001

(54) METHOD OF FABRICATING SHALLOW TRENCH ISOLATION STRUCTURE

(75) Inventors: Kun-Lin Wu, Taichung; Cheng-Jung Hsu, Hsinchu, both of (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/208,282

(22) Filed: Dec. 8, 1998

(51) Int. Cl.[7] .................................................. H01L 21/76
(52) U.S. Cl. ........................ 438/400; 438/424; 438/425
(58) Field of Search .................................. 438/296, 425, 438/431, 434, 424, 400

(56) References Cited

U.S. PATENT DOCUMENTS

| | | | |
|---|---|---|---|
| 5,918,131 | * | 6/1999 | Hsu et al. ............................ 438/296 |
| 5,981,353 | * | 11/1999 | Tsai ..................................... 438/424 |
| 5,981,402 | * | 11/1999 | Hsiao et al. ......................... 438/756 |
| 5,994,201 | * | 11/1999 | Lee ...................................... 438/427 |
| 6,037,237 | * | 3/2000 | Park et al. ........................... 438/424 |

OTHER PUBLICATIONS

"Silicon Processing For VSLI Era" Wolf et al. pp. 182–189, Jan. 1986.*

* cited by examiner

*Primary Examiner*—John F. Niebling
*Assistant Examiner*—Walter L. Lindsay
(74) *Attorney, Agent, or Firm*—Thomas, Kayden, Horstemeyer & Risley

(57) ABSTRACT

A method of fabricating shallow trench isolation. A silicon oxide layer is formed on a substrate. The silicon oxide layer is patterned and a portion of the substrate is removed to form a trench within the substrate. A liner oxide layer is formed on the sidewall of the trench. An insulating layer is formed on the substrate and filled in the trench. A portion of the insulating layer is removed by CMP to expose the silicon oxide layer. The silicon oxide layer is removed and the STI structure is completed.

14 Claims, 4 Drawing Sheets

METHOD OF FABRICATING SHALLOW TRENCH ISOLATION STRUCTURE

BACKGROUND OF THE INVENTION

1. Field of the Invention

The invention relates to a method of fabricating a shallow trench isolation (STI) structure, and more particularly to a method of fabricating a shallow trench isolation structure that can prevent micro-scratches from occurring on the STI structure.

2. Description of the Related Art

STI structure is widely used in semiconductor process of 0.25 µm. The fabrication of the STI structure includes the step of anisotropically etching a trench within a substrate, depositing an oxide layer in the trench and planarizing the oxide layer by chemical mechanical polishing (CMP) to provide an even surface.

FIGS. 1A–1F are side views illustrating fabrication of a STI structure in prior art. Referring to FIG. 1A, a pad oxide layer 11 is thermally formed on a substrate 10. A silicon nitride layer 12 is formed on the pad oxide layer 11 by chemical vapor deposition (CVD).

Referring to FIG. 1B, a patterned photoresist layer 13 is formed on the silicon nitride layer 12. Using the photoresist layer 13 as an etching mask, a portion of the silicon nitride layer 12, the pad oxide layer 11 and the substrate 10 are removed to form a trench 16 within the substrate 10.

Referring to FIG. 1C, the photoresist layer 13 of FIG. 1B is removed. A liner oxide layer 14 is formed on the sidewall of the trench 16.

Referring to FIG. 1D, a silicon oxide layer 15 is formed on the liner oxide layer 14 and the silicon nitride layer 12 to fill the trench 16.

Referring to FIG. 1E, a portion of the silicon oxide layer 15 is removed by CMP to expose the silicon nitride layer 12.

Referring to FIG. 1F, the silicon nitride layer 12 and the pad oxide layer 11 are removed, respectively, by wet etching and the STI structure is completed.

The silicon nitride layer 12 is used as a stop layer and CMP is performed on the silicon oxide layer 15 in the process as described above. During the process of CMP, since the hard material of the silicon nitride layer 12 is polished by CMP, silicon nitride particles are easily produced from polishing and cause micro-scratch 17 to occur on the silicon oxide layer 15a. Stringer is thus produced on a polysilicon layer subsequently deposited and a short occurs in the semiconductor device. Otherwise, the in the foregoing process, it is necessary to remove the silicon nitride layer 12 by dry etching, which increases both the cost of the fabrication and cycle time of the process. In addition, stress between the silicon nitride layer 12, the pad oxide layer 11 and the silicon oxide layer 15a causes dislocation of surface atoms of the substrate 10 and reduces the reliability of devices.

SUMMARY OF THE INVENTION

It is therefore an object of the invention to provide a method of fabricating a STI structure to prevent micro-scratches from occurring on the STI structure.

It is another object of the invention to provide a method of fabricating a STI structure to prevent dislocation from happening in the substrate.

It is yet another object of the invention to provide a method of fabricating an STI structure with a simplified process and reduced process cycle time of the process can be reduced.

To achieve these objects and advantages, and in accordance with the purpose of the invention, as embodied and broadly described herein, the invention is directed towards a method of fabricating a shallow trench isolation structure. A silicon oxide layer is formed on a substrate. The silicon oxide layer is patterned and a portion of the substrate is removed to form a trench within the substrate. A liner oxide layer is formed on the sidewall of the trench. An insulating layer is formed on the substrate and fills the trench. A portion of the insulating layer is removed by CMP to expose the silicon oxide layer. The silicon oxide layer is removed and the STI structure is completed.

It is to be understood that both the foregoing general description and the following detailed description are exemplary and explanatory only and are not restrictive of the invention, as claimed.

DESCRIPTION OF THE PREFERRED EMBODIMENTS

Figure 1A:
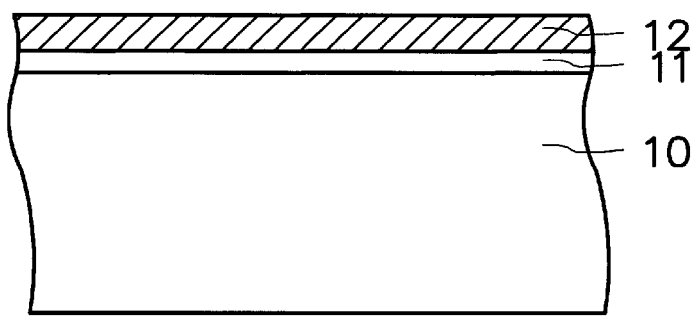
FIGS. 1A–1F are schematic, cross-sectional views illustrating fabrication of a STI structure known in prior art.
Figure 1B:
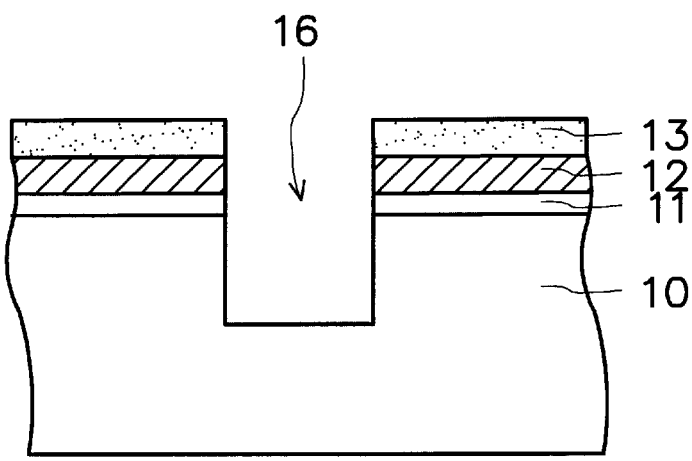
Figure 1C:
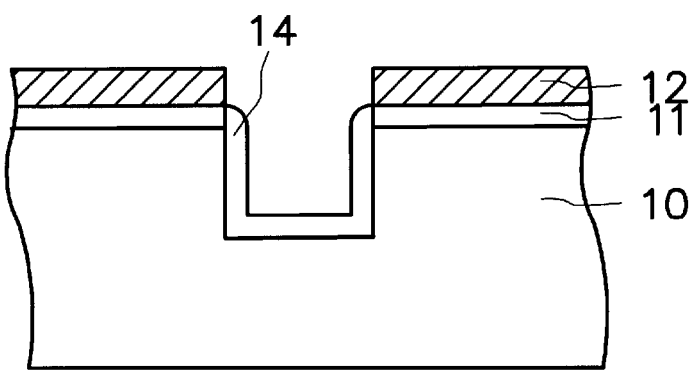
Figure 1D:
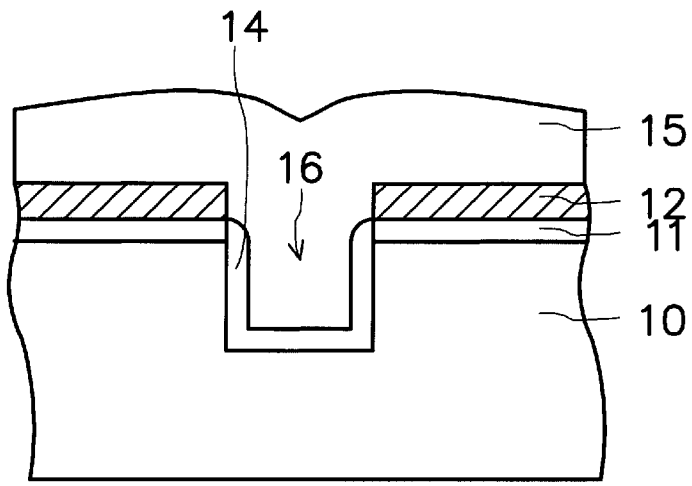
Figure 1E:
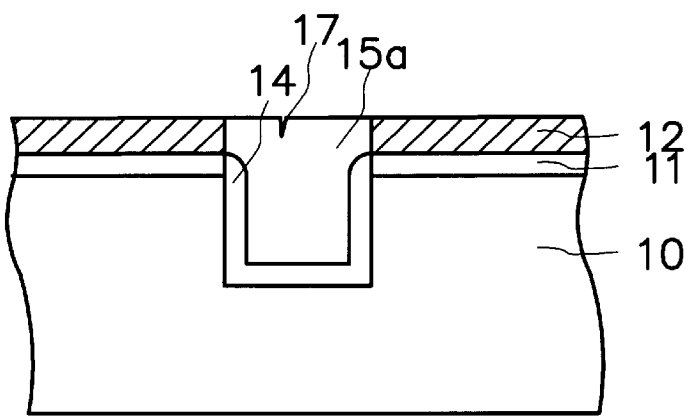
Figure 1F:
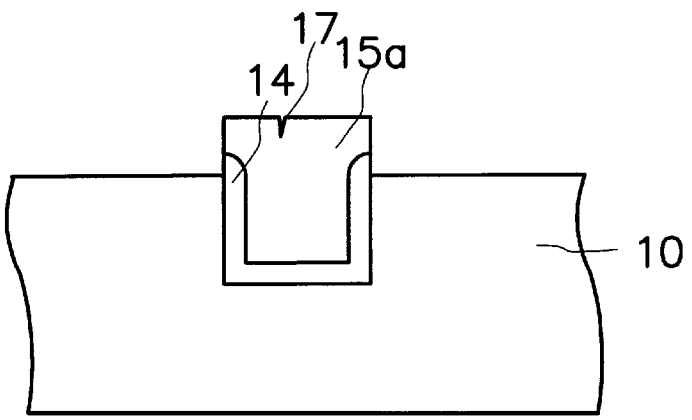
Figure 2A:
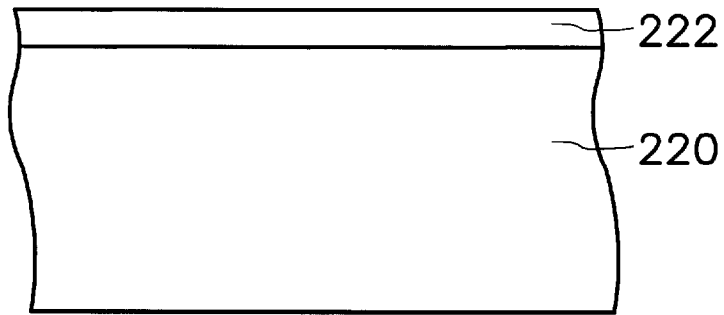
FIGS. 2A–2F are schematic, cross-sectional views illustrating fabrication of a STI structure in a preferred embodiment according to the invention.

Referring to FIG. 2A, a silicon oxide layer 222 is formed by such as thermal oxidation, atmospheric pressure chemical vapor deposition (APCVD) or low pressure chemical vapor deposition (LPCVD) on a substrate 220. The thickness of the silicon oxide layer 222 is about 2000–5000 Å.

Figure 2B:
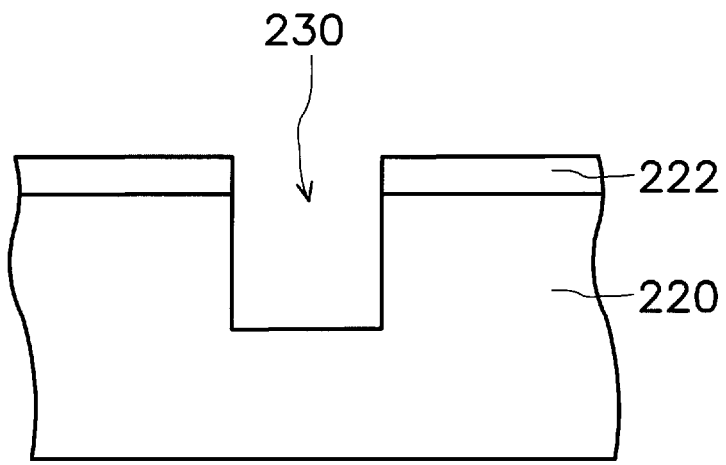

Referring to FIG. 2B, the silicon oxide layer 222 is patterned and a portion of the substrate 220 is then removed. A trench 230 is therefore formed within the substrate 220. Normally, a patterned photoresist layer is coated on the silicon oxide layer 222. Using the photoresist layer as a mask, a portion of the silicon oxide layer 222 and the substrate 220 are removed by anisotropic etching to form the trench 230. The photoresist layer is then removed.

Figure 2C:
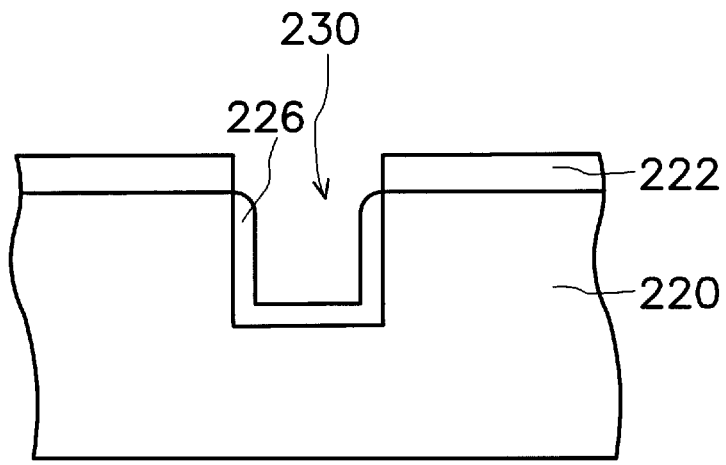

Referring to FIG. 2C, a liner oxide layer 226 is then formed on the sidewall of the trench 230 by thermal oxidation and its thickness is about 220–900 Å.

Figure 2D:
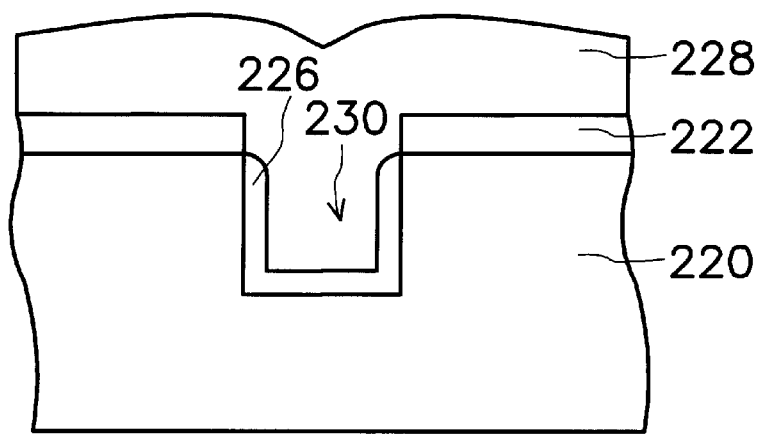

Referring FIG. 2D, an insulating layer 228 with a thickness of about 5000–10000 Å is formed on the substrate 220 and fills the trench 230 of FIG. 2C. The insulating layer 28 includes a silicon oxide layer, which is formed by APCVD and reactant source for forming the silicon oxide layer includes ozone (O3) and tetra-ethyl-ortho-silicate. The silicon oxide layer 228 is then densified by furnace and rapid thermal process at a high temperature of about 850° C. and a period of time of about 5–60 min, and the structure of the silicon oxide layer 228 becomes denser. The silicon oxide layer 228 can be formed by high-density plasma chemical vapor deposition (HDPCVD).

Figure 2E:
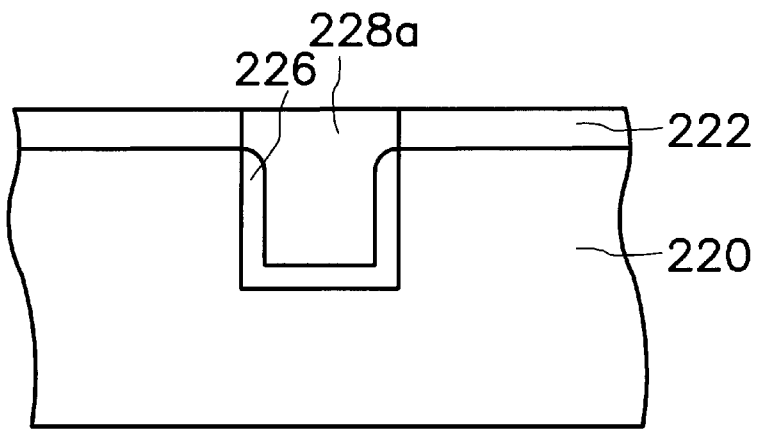

Referring to FIG. 2E, a portion of the insulating layer 228 is then removed by CMP to expose the silicon oxide layer 222. Time mode control or end point mode control can be applied in the CMP process to determine the final thickness of the silicon oxide layer 222 and the insulating layer 228a.

Figure 2F:
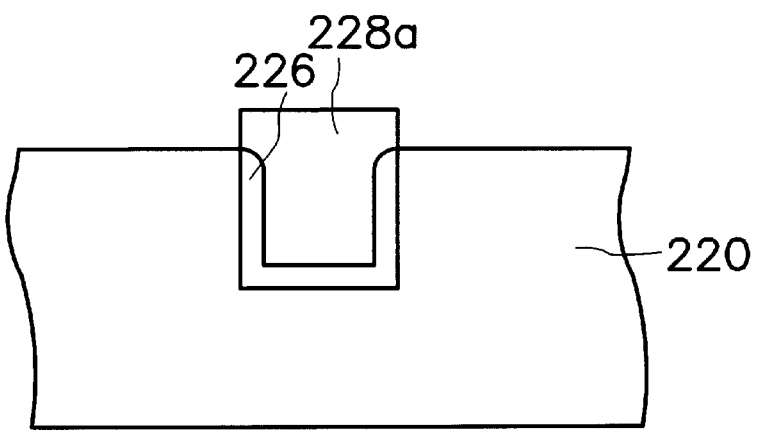

Referring to FIG. 2F, the silicon oxide layer 222 is removed. The typical method of removing the silicon oxide layer 222 is wet etching by dipping the substrate 220 into a HF solution. The liner oxide layer 226 and the silicon oxide layer 228 are left to complete the STI structure.

The silicon nitride layer in prior art is not formed in the invention, so that microscratches on the substrate and dislocation in the substrate do not occur. The wet etching to remove the silicon nitride layer is not necessary, such that the cost and the cycle time for fabricating the STI structure can be reduced.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating shallow trench isolation, comprising:

providing a substrate;

forming a silicon oxide layer on the substrate;

forming a trench within the substrate by patterning the silicon oxide layer and the substrate;

forming an insulating layer over the substrate and filling the trench;

removing a portion of the insulating layer to expose the silicon oxide layer;

removing the silicon oxide layer; and wherein the method recited above does not include forming any nitride layer.

2. The method according to claim 1, wherein forming the silicon oxide layer includes thermal oxidation.

3. The method according to claim 1, wherein forming the silicon oxide layer includes APCVD.

4. The method according to claim 1, wherein forming the silicon oxide layer includes LPCVD.

5. The method according to claim 1, wherein the thickness of the silicon oxide layer is in a range of about 2200–5000 Å.

6. The method according to claim 1, wherein the material of the insulating layer includes silicon oxide layer.

7. The method according to claim 6, wherein forming the insulating layer includes APCVD.

8. The method according to claim 6, wherein forming the insulating layer includes HDPCVD.

9. The method according to claim 6, wherein the thickness of the insulating layer is in a range of about 5000–10000 Å.

10. The method according to claim 1, wherein removing the silicon oxide layer includes wet etching.

11. The method according to claim 1, wherein removal of a portion of the insulating layer is controlled by time mode control.

12. The method according to claim 1, wherein removal of a portion of the insulating layer is controlled by end point mode control.

13. A method of fabricating shallow trench isolation wherein a substrate is provided, comprising:

forming a silicon oxide layer on the substrate;

patterning the silicon oxide layer and removing a portion of the substrate to form a trench within the substrate;

forming a liner oxide layer on a sidewall of the trench;

forming an insulating layer over the substrate for filling the trench;

planarizing the insulating layer by CMP to expose the silicon oxide layer;

removing the silicon oxide layer; and wherein the method recited above does not include forming of silicon nitride layer.

14. A method of fabricating shallow trench isolation in a substrate, comprising:

forming a first oxide layer on the substrate;

forming the first oxide layer and the substrate so that a trench is formed in the substrate;

forming a second oxide layer on a sidewall of the trench;

forming a third oxide layer directly on the first and second oxide layers for filling the trench;

planarizing the third oxide layer by CMP until the first oxide layer is exposed; and removing the first oxide layer.

* * * * *